United States Patent [19]

Brombal et al.

[11] Patent Number: 4,631,641
[45] Date of Patent: Dec. 23, 1986

[54] ELECTRONIC APPARATUS WITH ELECTRO-MAGNETIC INTERFERENCE SCREENING

[75] Inventors: David S. Brombal, Dunrobin; Charles B. D. Bunner; Nickolas S. Gulis, both of Carp; John P. Luszczek, Nepean, all of Canada

[73] Assignee: Northern Telecom Limited, Montreal, Canada

[21] Appl. No.: 756,421

[22] Filed: Jul. 18, 1985

[51] Int. Cl.$^4$ .............................................. H05K 9/00
[52] U.S. Cl. .................................. 361/424; 174/35 R
[58] Field of Search ............... 361/395, 399, 415, 424; 174/35 R, 35 MS, 35 GC

[56] References Cited

U.S. PATENT DOCUMENTS 2,978,531 4/1961 Appleman ...................... 174/35 MS
3,975,805 8/1976 Spurling et al. ..................... 361/415
4,322,572 3/1982 Snyder ............................. 174/35 R
4,434,537 3/1984 Bean et al. .......................... 361/395

Primary Examiner—A. D. Pellinen
Assistant Examiner—Morris Ginsburg
Attorney, Agent, or Firm—R. John Haley

[57] ABSTRACT

An electrically conductive enclosure, consisting of side, top, and bottom members, extends between a ground conductor on a backpanel and electrically conductive faceplates at front edges of circuit boards inserted into connectors on the backpanel and guided by channels in the top and bottom members, thereby forming an EMI-screened arrangement. To provide effective EMI screening, resilient electrically conductive strips are provided between the faceplates and the enclosure, and adjacent faceplates are electrically interconnected. In order to avoid excessive lateral forces on the faceplates, the interconnections therebetween are provided by electrically conductive clips provided in and projecting from a slot in one side of each faceplate.

14 Claims, 10 Drawing Figures

ELECTRONIC APPARATUS WITH ELECTRO-MAGNETIC INTERFERENCE SCREENING

This invention relates to electronic apparatus, and is particularly concerned with such apparatus which is screened to suppress electro-magnetic interference, hereinafter referred to as EMI.

Electronic apparatus is being required to meet increasingly strict EMI standards. In order to meet such standards, EMI shielding or screening of the apparatus is required, the shielding typically comprising an electrically conductive, e.g. metal, enclosure surrounding the entire apparatus. In order to allow an air flow for cooling the apparatus, part of such an enclosure may comprise open metal grids or meshes.

In order to meet EMI standards in the U.S.A., it has been determined for one type of apparatus that there must be no opening in the EMI shielding having a length in any direction greater than about 5 cm. (2 inches). This requirement poses a significant problem in the design of the enclosure. In particular, joints in the enclosure must be closely fitting, and opening doors provided for enabling access to the apparatus must be sealed with EMI gaskets.

A further significant problem arises in routing and connecting cables to the apparatus, especially where relatively large numbers of cables are required. In particular, openings in the enclosure through which cables may pass must be sufficiently small that the EMI standards are met.

An object of this invention is to provide improved electronic apparatus in which EMI is avoided in an advantageous and convenient manner.

According to one aspect of this invention there is provided electronic apparatus comprising: a backpanel including a plurality of connectors; a plurality of circuit boards each connected to the backpanel at a back edge of the board and including at an opposite, front, edge of the board a faceplate comprising electrically conductive material; an electrically conductive enclosure extending between the backpanel at a back edge of the enclosure and the faceplates at a front edge of the enclosure; and electrically conductive means electrically interconnecting the faceplates around their peripheries with one another and with the enclosure at its front edge; the backpanel including a ground conductor to which the enclosure is electrically connected around the periphery of its back edge.

Thus in accordance with this invention, instead of electronic apparatus being constructed and then put into an EMI shielding enclosure, the apparatus consists of one shelf of circuit boards which itself constitutes an EMI shielding enclosure. In consequence, an outer enclosure for the apparatus does not need to constitute an EMI shielding enclosure, simplifying its design and facilitating routing of cables for connection to the circuit boards, the cables enclosure at substantially its front edge and an adjacent faceplate. It may also comprise such strip material between adjacent faceplates, but this introduces excessive lateral forces on the faceplates and circuits boards, necessary to compress the numerous resilient strips.

In order to avoid such excessive lateral forces, preferably each faceplate includes a first side having a substantially flat surface and a second side having a slot extending therein along the length of the faceplate, and the electrically conductive means comprises a plurality of clip members spaced along said length, each clip member comprising a first portion in the slot and a second portion extending laterally from the slot for electrically contacting the flat surface on the first side of an adjacent faceplate. Much lower lateral forces are required between the faceplates in this case, whilst still providing effective EMI screening.

Advantageously the slot is recessed, the first portion of each clip member being wider than the second portion and being accommodated in the recessed part of the slot so that the clip member is laterally retained in the slot. Preferably the second portion of each clip member extends substantially perpendicularly from the first portion for electrically contacting the flat surface on the first side of an adjacent faceplate.

According to another aspect this invention provides a faceplate for a circuit board, the faceplate comprising extruded electrically conductive material and having first and second sides, the first side having a substantially flat surface and the second side having a recessed slot therein laterally opposite the substantially flat surface and extending along the length of the faceplate. The faceplate preferably includes a plurality of electrically conductive clip members each comprising a first portion laterally retained in the recessed slot and a second, narrower, portion extending substantially perpendicularly from the first portion laterally outwardly of the slot, the clip members being spaced along the length of the slot.

The invention also extends to the combination of a faceplate as recited above with a circuit board attached thereto along one edge of the circuit board.

The invention will be further understood from the following description with reference to the accompanying drawings, in which.

The same reference numerals are used throughout the drawings to refer to similar parts of the apparatus.

Figure 1:
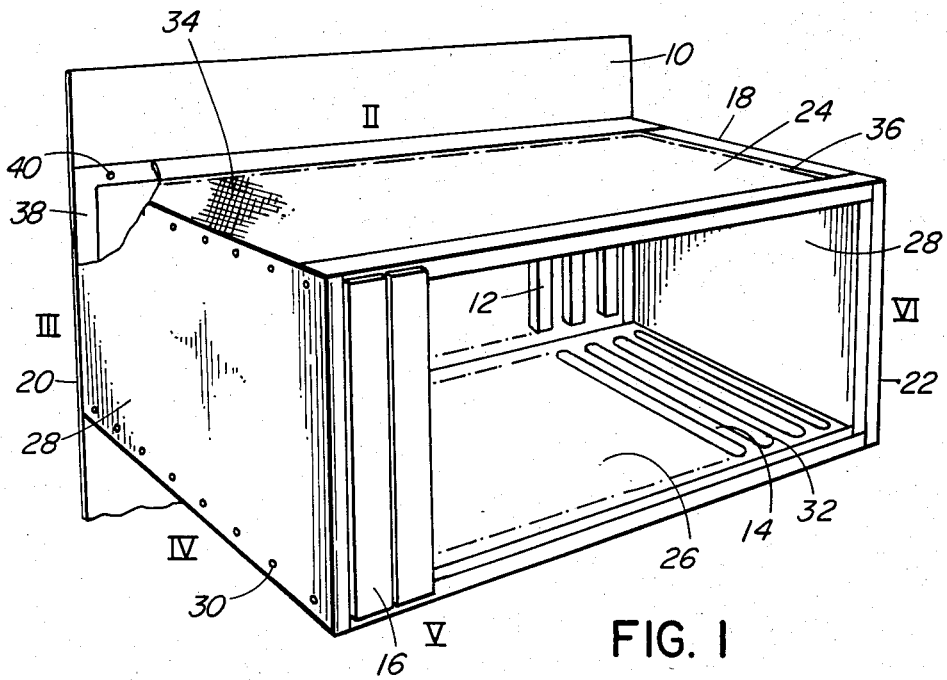
FIG. 1 is a partly cut-away general illustration of electronic apparatus in accordance with an embodiment of the invention.

Referring to FIG. 1, the illustrated apparatus comprises a backpanel 10 having on a front surface thereof a plurality of parallel circuit board connectors 12 only some of which are shown. Circuit boards (not shown separately in FIG. 1) guided by channels 14 plug into the connectors 12 in conventional manner at their back edges, and have faceplates 16 at their front edges as described in greater detail below. When circuit boards are inserted in all of the connectors 12, their faceplates 16 form a generally planar front face of the apparatus, parallel to the backpanel 10. One or more of such circuit boards may be dummy boards provided simply to complete this front face. The backpanel 10 may be positioned at a back of the apparatus, in which case it conveniently has a ground plane on its back face, or it may be positioned centrally in the apparatus with a second set of circuit boards, and a similar arrangement to that illustrated, on its back face, in which case it conveniently has a central ground plane. In either case the ground plane (not shown) of the backpanel serves as an EMI screen. In addition to being stacked on both sides of the backpanel 10, such apparatuses can be stacked vertically and/or side by side.

Figure 2:
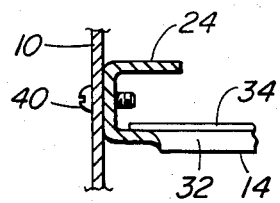
FIGS. 2 to 6 are partial cross-sectional illustrations showing the EMI sealing provided in the apparatus at points II to VI respectively in FIG. 1.
Figure 3:
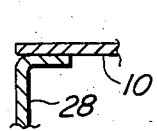
Figure 4:
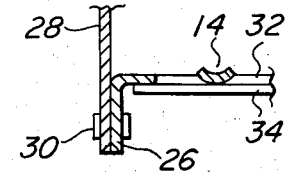
Figure 5:
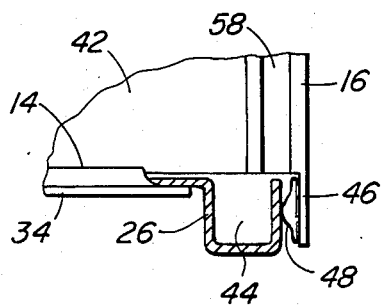
Figure 6:
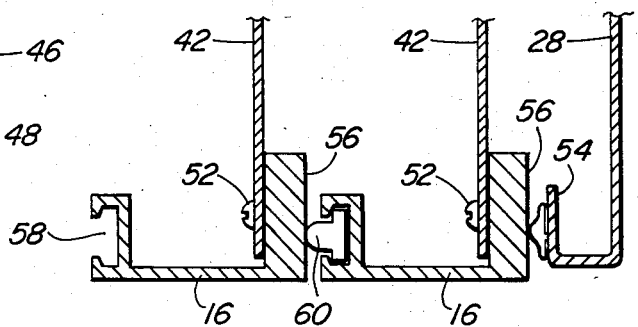

A generally rectangular electrically conductive enclosure 18 for the circuit boards extends between the backpanel 10 at a back edge 20 of the enclosure and the faceplates 16 at a front edge 22 of the enclosure. The enclosure 18 consists of top and bottom members 24 and 26 respectively, and two side members 28, which are rivetted together along their edges by rivets 30 which are spaced apart by a distance of about 5 cm. or less. The side members 28 are of electrically conductive material such as sheet steel, and have their back and front edges folded as shown in FIGS. 3 and 6 respectively. The top and bottom members 24 and 26 are similar to one another, only parts of each member being illustrated in FIG. 1 for clarity. Each of these members 24 and 26 comprises a sheet steel member, whose back, front, and side edges are folded as shown in FIGS. 2, 5, and 4 respectively, having elongate apertures 32 therein between which the channels 14 are formed as is best shown in FIGS. 4 and 5. On the outer surfaces (i.e. the upper surface of the top member 24 and the lower surface of the bottom member 26) of these members are wire meshes 34, which are welded to the sheet steel members around their peripheries shown by a chained line 36 in FIG. 1.

The holes in the meshes 34 and the apertures 32 are sufficiently large to allow air to circulate or be blown vertically through the apparatus between the circuit boards for cooling purposes, whilst being sufficiently small that the meshes 34 still act as effective EMI screens. The enclosure 18 thus forms an EMI screen around the sides, top, and bottom of the apparatus, the ground plane of the backpanel 10 forming an EMI screen at the back, and the faceplates 16, which are of electrically conductive material such as extruded aluminum, forming an EMI screen at the front, of the apparatus. In order to complete this screening in an effective manner, the apparatus includes EMI sealing between the backpanel 10 and the back edge 20 of the enclosure 18 around the periphery of this back edge, and between the faceplates 16 and the front edge 22 of the enclosure 18 around the peripheries of all of the faceplates 16.

The latter EMI sealing is described in greater detail below. The former EMI sealing comprises a ground conductor 38 on the front face of the backpanel 10 and extending around the entire periphery of the back edge 20 of the enclosure 18 for electrical contact therewith. Screws 40, spaced apart by a distance of about 5 cm. or less along the back edges of the top and bottom members 24 and 26, are screwed through the backpanel 10 and into these members as best shown in FIG. 2. The back edges of the side members 28 are folded as best shown in FIG. 3 to abut and electrically contact the ground conductor 38. In this manner a good electrical contact, and hence an effective EMI seal, is ensured around the entire periphery of the back edge 20 of the enclosure 18. The ground conductor 38 is itself grounded or earthed.

FIGS. 2, 3, and 4, showing cross-sections at the junction between respectively the top member 24 and the backpanel 10, the left-hand side member 28 and the backpanel 10, and the left-hand side member 28 and the bottom member 26, require no further description.

FIG. 5 shows a cross-section at the junction between the bottom member 26 and a faceplate 16 which is attached to a circuit board part of which is shown and referenced 42. The bottom member 26 has a U-shaped channel 44 formed at its front edge (the top member 24 has a corresponding, but inverted, shape), which channel forms a recess for engagement of a latching lever (not shown) of the circuit board in known manner. (See for example U.S. Pat. No. 4,233,646 is issued Nov. 11, 1980). When the board is inserted into the respective connector 12, its latching levers are operated in known manner to engage the channels 44 and latch the board 42 in place, pulling the faceplate 16 into engagement with the front edges of the bottom and top members 24 and 26. A downwardly extending projection 46 of the front of the faceplate 16 is thereby pulled towards this front edge, with a corresponding action at the top of the faceplate 16, to compress therebetween a resilient electrical contact strip 48 which is adhesively secured to the back of this projection 46. The contact strip 48 ensures and electrical connection, and hence an EMI seal, between the electrically conductive faceplace 16 and the bottom member 26.

Figure 7:
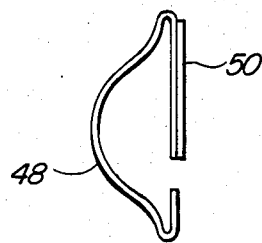
FIG. 7 is an enlarged cross-sectional illustration of a known form of EMI sealing strip used in the apparatus as illustrated in FIGS. 5 and 6.

The contact strip 48, which is shown in greater detail in FIG. 7, consists of a beryllium-copper strip which is segmented along its length and which has an electrically conductive adhesive backing 50 on one part thereof. Such a strip is commerically available as Tech-Etch type 156M32 No-Snag Fingers.

FIG. 6 shows a cross-section at the junction between the right-hand side member 28 and a right-hand-most faceplate 16, and at the junction between two adjacent faceplates 16. Each faceplate 16 is attached, for example by screws 52, to a respective circuit board 42, and is of extruded aluminum with a cross-section as illustrated in FIG. 6.

For forming an EMI seal between the right-hand side member 28 and the adjacent faceplate 16, a contact strip 48 as shown in FIG. 7 is attached along the entire length of a folded back portion 54 of the side member 28, whereby it is compressed by and electrically connects to a flat right-hand side face 56 of the faceplate 16. An EMI seal is thereby formed along the length of the junction between the right-hand side member 28 and the adjacent faceplate 16. A similar arrangement can optionally be provided between the left-hand side member 28 and its adjacent faceplate 16, with or without the EMI sealing described below.

Whilst a similar arrangement could conceivably be provided along the junction between each pair of adjacent faceplates 16, in practice this tends to result in excessively high lateral, or sideways, forces being necessary in order to compress the numerous lengths of contact strip 48. In order to avoid such excessive lateral forces, in the present apparatus a different form of EMI sealing is provided between each pair of adjacent faceplates 16.

As shown in FIGS. 5 and 6, the left-hand side edge of each faceplate 16 includes a recessed slot 58 which, when circuit boards 42 are inserted into adjacent connectors 12 on the backpanel 10, is positioned opposite the flat face 56 of the faceplate 16 to its left. Electrically conductive clips 60, which are described in detail below with reference to FIGS. 8 to 10, are slid into each slot 58 from one or both ends thereof before insertion of the circuit boards 42 into the apparatus, and are spaced apart along the length of the slot with a spacing of about 5 cm. or less.

Figure 8:
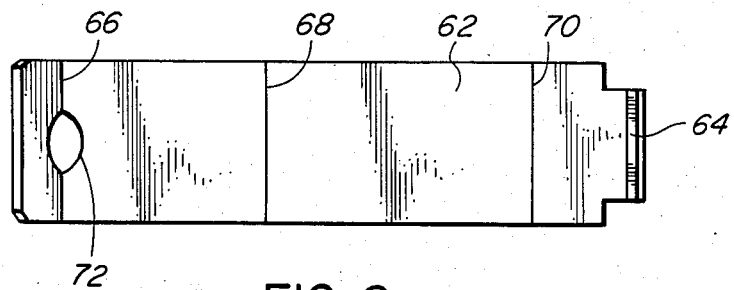
FIGS. 8 to 10 illustrate a preferred form of EMI sealing member used in the apparatus as illustrated in FIG. 6.
Figure 9:
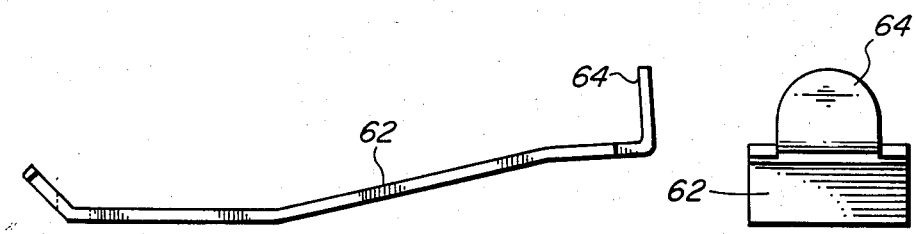
Figure 10:
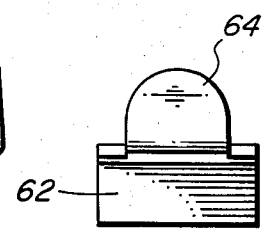

As shown in FIGS. 8 to 10, each clip 60 comprises a heat treated spring strip of beryllium copper alloy which is shaped and bent to provide a body 62 and a rounded projection 64. The body 62 has a width such that it can be accommodated in the recessed part of the slot 58, and is bent along bend lines 66, 68, and 70 in such a manner and to a sufficient degree that it can be resiliently moved in the slot 58, but normally remains in place in the slot due to its lateral bearing against the surfaces of the slot. The projection 64 has a narrower width than the body 62, so that it can extend through the opening of the slot 58 when the clip 60 is inserted into the slot, and extends approximately perpendicularly from the body 62 at one end thereof. As shown in FIG. 6, the projection 64 thereby electrically contacts the flat face 56 of the adjacent faceplate 16, so that the several clips 60 spaced along the length of each slot 58 provide a series of such electrical contacts and hence an effective EMI seal between the faceplates 16. At the same time, the lateral forces required to compress the clips 60 in order to accommodate all of the faceplates 16 are very much less than those required using the contact strips 48.

The clip 60 can also include, as shown in FIGS. 8 and 9, a hole 72, conveniently positioned at the bend line 66, which can be readily engaged by the end of a thin rod or other tool to facilitate sliding of the clip along the slot 58 and positioning of the clip therein. In addition, while the clip 60 shown in FIGS. 8 to 10 has only a single projection 64 at one end thereof, it should be appreciated that the clip may be readily modified to provide two such projections, one at each end of a body portion, spaced apart by a suitable distance of, for example, up to about 5 cm. With such a modification, a smaller number of clips may be used in each slot 58.

The above described apparatus provides effective EMI screening in a manner which is particularly convenient in the event that many cables must be connected to the circuit boards. In this case, cable connectors can be provided on the faceplates 16 for establishing connections through the faceplates to the circuit boards. In consequence, cables can be connected and disconnected without disturbing the effectiveness of the EMI screening provided by the apparatus. In addition, the routing of the cables themselves is facilitated, because this routing is no longer constrained by restrictive EMI screening requirements.

Numerous modifications, variations, and adaptations may be made to the particular embodiment of the invention described above without departing from the scope of the invention, which is defined in the claims.

What is claimed is:

1. Electronic apparatus comprising:
   a backpanel including a plurality of connectors;
   a plurality of circuit boards each connected via a connector to the backpanel at a back edge of the board and including at an opposite, front, edge of the board a faceplate comprising electrically conductive material;
   an electrically conductive enclosure extending between the backpanel at a back edge of the enclosure and the faceplates at a front edge of the enclosure; and
   electrically conductive means electrically interconnecting the faceplates around their peripheries with one another and with the enclosure at its front edge, adjacent faceplates being electrically interconnected by the electrically conductive means therebetween;
   the backpanel including a ground conductor to which the enclosure is electrically connected around the periphery of its back edge.

2. Apparatus as claimed in claim 1 wherein the ground conductor is on a front face of the backpanel.

3. Apparatus as claimed in claim 1 wherein the enclosure comprises two side members, a top member, and a bottom member, the top and bottom members comprising channels for guiding the circuit boards, apertures for allowing ventilation, and an electrically conductive mesh over the apertures.

4. Apparatus as claimed in claim 1 wherein the electrically conductive means comprises resilient electrically conductive adhesive strip material between the faceplates and the front edge of the enclosure.

5. Apparatus as claimed in claim 3 wherein the electrically conductive means comprises resilient electrically conductive strip material between the top and bottom members of the enclosure at its front edge and top and bottom regions of the faceplates.

6. Apparatus as claimed in claim 5 wherein the strip material is adhesively secured to the top and bottom regions of the faceplates.

7. Apparatus as claimed in claim 3 wherein the electrically conductive means comprises resilient electrically conductive strip material between at least one side member of the enclosure at substantially its front edge and an adjacent faceplate.

8. Apparatus as claimed in claim 1 wherein the electrically conductive means comprises resilient electrically conductive strip material between adjacent faceplates.

9. Electronic apparatus comprising:
   a backpanel including a plurality of connectors;
   a plurality of ciruit boards each connected via a connector to the backpanel at a back edge of the board and including at an opposite, front, edge of the board a faceplate comprising electrically conductive material;
   an electrically conductive enclosure extending between the backpanel at a back edge of the enclosure and the faceplates at a front edge of the enclosure; and
   electrically conductive means electrically interconnecting the faceplates around their peripheries with one another and with the enclosure at its front edge;
   the backpanel including a ground conductor to which the enclosure is electrically connected around the periphery of its back edge;
   wherein each faceplate includes a first side having a substantially flat surface and a second side having a slot extending therein along the length of the faceplate, wherein the electrically conductive means comprises a plurality of clip members spaced along said length, each clip member comprising a first portion in the slot and a second portion extending laterally from the slot for electrically contacting the flat surface on the first side of an adjacent faceplate.

10. Apparatus as claimed in claim 9 wherein the slot is recessed, the first portion of each clip member being wider than the second portion and being accommodated in the recessed part of the slot so that the clip member is laterally retained in the slot.

11. Apparatus as claimed in claim 10 wherein the second portion of each clip member extends substantially perpendicularly from the first portion for electrically contacting the flat surface on the first side of an adjacent faceplate.

12. Apparatus as claimed in claim 10 wherein the first portion of each clip member is bent whereby it frictionally engages the slot.

13. Apparatus as claimed in claim 10 wherein the faceplate is of extruded electrically conductive material.

14. In combination, a faceplate and a circuit board attached to the faceplate along a front edge of the circuit board, the faceplate comprising extruded electrically conductive material and having first and second side facing outwardly of the faceplate in respective planes substantially parallel to a plane of the circuit board, the first side having a substantially flat surface and the second side having a recessed slot therein laterally opposite the substantially flat surface and extending along the length of the faceplate, the faceplate including a plurality of electrically conductive clip members each comprising a first portion laterally retained in the recessed slot and a second, narrower, portion extending substantially perpendicularly from the first portion laterally outwardly of the slot, the clip members being spaced along the length of the slot.

* * * * *